United States Patent [19]
Ovshinsky et al.

[11] Patent Number: 4,777,090
[45] Date of Patent: Oct. 11, 1988

[54] COATED ARTICLE AND METHOD OF MANUFACTURING THE ARTICLE

[75] Inventors: Stanford R. Ovshinsky, Bloomfield Hills; Russell C. Custer, Clawson; Arnold Register, Lake Orion; James D. Flasck, Rochester; Daniel P. Durisin, Allen Park; Kenneth Havener, Detroit, all of Mich.

[73] Assignee: Ovonic Synthetic Materials Company, Troy, Mich.

[21] Appl. No.: 926,271

[22] Filed: Nov. 3, 1986

[51] Int. Cl.$^4$ .............. B32B 9/06; B32B 9/04; B32B 9/00; B05D 3/02
[52] U.S. Cl. ..................... 428/408; 428/336; 428/412; 428/433.1; 428/446; 428/457; 428/500; 428/702; 427/45.1
[58] Field of Search ............... 427/45.1; 423/445, 446; 428/336, 408, 412, 423.1, 446, 688, 689, 702

[56] References Cited

U.S. PATENT DOCUMENTS 4,504,519  3/1985  Zelez ........................... 428/408 X
4,569,738  2/1986  Kieser et al. ................ 427/45.1 X

FOREIGN PATENT DOCUMENTS 157212  10/1985  European Pat. Off. ............ 428/408
175980   4/1986  European Pat. Off. ............ 423/446

Primary Examiner—John E. Kittle
Assistant Examiner—Susan S. Rucker
Attorney, Agent, or Firm—Richard M. Goldman; Marvin S. Siskind

[57] ABSTRACT

Disclosed is a coated article having a substrate with an adherent, abrasion resistant carbon coating. In a preferred examplification the coating is substantially transparent to visible light and partially absorbing to ultraviolet light. The coating has a relatively disordered portion at the substrate-coating interface and a relatively ordered portion remote from the substrate-coating interface. The coating is a microwave deposited coating with deposition initially at a low microwave energy, and thereafter at a high microwave energy.

13 Claims, 6 Drawing Sheets

COATED ARTICLE AND METHOD OF MANUFACTURING THE ARTICLE

FIELD OF THE INVENION

The invention relates to articles, e.g., soft metallic articles and transparent polymeric articles, having a hard, and preferably transparent coating thereon.

BACKGROUND OF THE INVENTION

Objects and materials having a hard coating thereon find wide application. However, the full utilization of hard coatings has been limited by mismatches of, e.g., coefficient of thermal expansion, modulus of elasticity, lattice parameter, extent of crystallinity, degree of crystallinity, and compositional and/or structural dissimilarity, between the substrate and the coating.

For example, while plastic optical elements and transparencies are subject to abrasion and hazing, plastic articles having hard coatings thereon find utility in many areas.

For example, hard coatings applied to the outside surfaces of optical fibers provide protection to plastic optical fibers. This eliminates the need for cladding.

Other applications of hard coated plastic optical elements are in mirrors for high energy lasers.

Plastic is also used as the refractive element in lenses, for example ophthalmic lenses, and photographic, and telescopic lenses. Especially preferred are polycarbonate and polyallyl carbonate polymers for ophthalmic, sun glass, and safety goggle applications, and polymethyl methacrylate polymers for camera lenses, binocular lenses, telescope lenses, microscope objectives and the like. Plastic lenses have found good market acceptance and market penetration. However, the full potential of plastic lenses has been limited by their low resistance to abrasion, hazing, and scratching. Prior art abrasion resistant coatings, exemplified by polysilicate coatings and polysiloxane coatings, have not eliminated the problem of poor adhesion and poor abrasion resistance.

Plastic sheets with scratch and abrasion resistant coatings have found market acceptance in various automotive applications. These include headlight panels, sunroofs, side windows, and rear windows. However, the fuller utilization of plastic sheet material has been limited by the poor adhesion, and mismatch of thermal expansion coefficients between the plastic and the coating.

Large area plastic sheets have also found utility in applications such as doors, windows, walls, air craft windows, air craft canopies, vandalism and break-in resistant panels, windows and doors, and esthetic barriers. However, the poor abrasion resistance of these large sheets limit their more complete acceptance.

Plastic materials have also been utilized to provide a shatter resistant layer for large sheets of glass. The glass-plastic structure is exemplified by bi-layer windshields having a single sheet of glass on the weather incident side of the windshield, and a polymeric film, for example a polyurethane film, adherent to the glass on the interior side. These bi-layer windshields have not found market acceptance because of the very poor adhesion resistance to scratching and abrasion of the internal, polyurethane coating.

The inability to provide an adherent, abrasion resistant, substantially transparent coating has limited the full potential of the transparent plastics and other soft substrates.

Other materials which require a hard coating are semiconductors, e.g., photosensitive semiconductors. These semiconductors, utilized in, for example, imagers, photovoltaic cells, and electrophotographic drums, are subject to abrasion, scratching, and hazing. Photovoltaic cells are subject to these insults during manufacturing and service, while imagers and electrophotographic drums are subject to the scratching, scraping, and abrading effects of rough sliding documents. In the case of electrophotographic drums, these effects are exacerbated by submicron, particulate toners.

SUMMARY OF THE INVENTION

A coated article is provided having a soft substrate, e.g., a transparent plastic substrate, with an abrasion resistant, adherent coating. Preferably the coating is substantially transparent in the visible spectrum and partially absorbing in the ultraviolet range of the spectrum. The coating is adherent and of graded composition and structure. That is, at the substrate-coating interface the coating is matched to the substrate in one or more of composition, degree of crystallinity, extent of crystallinity, lattice parameters, modulus of elasticity, or coefficient of thermal expansion, and differs therefrom remote from the substrate coating interface. In this way adhesion is enhanced. For example, in the case of an amorphous carbon to diamond coating, the coating is substantially amorphous in contact with the substrate, and substantially ordered, as microcrystalline or polycrystalline, remote from the substrate. In the case of an amorphous carbon to silicon dioxide coating, the coating is amorphous carbon in contact with the substrate, and silicon dioxide remote therefrom the coating is a 1 to 10 micron thick layer, coating, or film of carbon or carbon and silicon dioxide, amorphous at the substrate and graded in composition and/or structure, e.g., diamond like or even diamond, or amorphous silicon dioxide, remote from the substrate. When silicon dioxide is referred to herein, it is to be understood that amorphous silicon dioxide, having the formula $SiO_x$, where x is from 1.6 to 2.0 is intended thereby. This graded coating is deposited from a microwave excited and maintained plasma under conditions of increasing microwave energy and decreasing gas pressure.

The coated articles may be ophthalmic lenses having adherent, abrasion resistant, substantially transparent coatings on polycarbonate or poly(allyl carbonate) substrates. Coated plastics are also useful as photographic lenses, binocular lenses, fiber optics, laser mirrors, goggles, microscope objectives and the like. They have an adherent, abrasion resistant, substantially transparent coating that is graded in composition and/or structure from amorphous carbon at its interface with the plastic substrate to ordered carbon e.g., diamond like or even diamond, remote therefrom or to silicon dioxide remote from the substrate - amorphous carbon interface. Preferably the coating is partially absorbing in the ultraviolet range. Alternatively the plastic substrate may be a plastic sheet as a window, door, wall, or automotive sun roof insert. The coated articles are also useful as part of a bi-layer of glass, plastic, and the contemplated abrasion resistant coating. These plastic substrates have low thermal degradation temperatures, i.e., low melting temperatures, low thermal decomposition temperatures, and/or low softening temperatures, and the power grading assists in avoiding thermal degradation of the substrate, as does other means of maintaing the plastic substrates at a low temperature.

According to a further exemplification, the coated articles may be semiconductors, e.g., photosensitive semiconductors, such as photovoltaic cells, imagers, and electrophotographic drums. These semiconductors have a layer of, e.g., amorphous silicon alloy, or indium tin oxide, with the herein contemplated graded layer.

The coated article, e.g., a transparent coated article, having an adherent, abrasion resistant coating, is prepared by placing the plastic substrate or the plastic surface of a glass-plastic bi-layer to be coated in a vacuum chamber. The chamber is pumped down to a low pressure, e.g., of less than $10^{-6}$ to $10^{-8}$ atmospheres. The substrates are sputter etched, e.g., radio frequency sputter etched with an argon atmosphere.

A deposition gas of an inert gas and a reactive precursor of the carbon or carbon-silicon dioxide coating is introduced into the vacuum chamber. The vacuum deposition chamber is maintained at a low pressure, for example less than 500 millitorrs and preferably less than 200 millitorrs and a microwave plasma is formed in contact with a substrate. The microwave energy is initially at low microwave power to decompose the gas and deposit a coating, matched to the substrate in one or more of modulus of elasticity, coefficient of thermal expansion, lattice parameters, extent of crystallinity, or degree of crystallinity, whereby to provide a high adhesion to the substrate. Thereafter, the microwave plasma in contact with the partially coated substrate is increased from a relatively low microwave energy to a relatively high microwave energy and graded in pressure, e.g. decreased from a relatively high pressure, e.g., about 100 to 200 millitorrs, to a relatively low pressure, e.g., about 25 to 75 millitorrs, whereby to form either a more ordered carbon deposit or an $SiO_2$ deposit atop the disordered carbon deposit, or increased in pressure to deposit diamond atop the disordered carbon.

The resulting coating, having a thickness of up to 10 microns is substantially transparent to light in the visible portion of the spectrum, having a transmissivity of about 89 percent integrated over the visible spectrum (amorphous carbon has a transmissivity of 83 percent under the same conditions), and partially absorbing in the ultraviolet radiation having a transmissivity of about 1 percent to about 5 percent in the ultraviolet portion of the spectrum. The coating is adherent and abrasion resistant, having an abrasion resistance corresponding to 17 to 25 percent haze by the method of ASTM 735-81.

DESCRIPTION OF THE DRAWINGS

The coated article and the method of preparing the coated article may be understood by reference to the Figures.

DETAILED DESCRIPTION OF THE INVENTION

Figure 1:
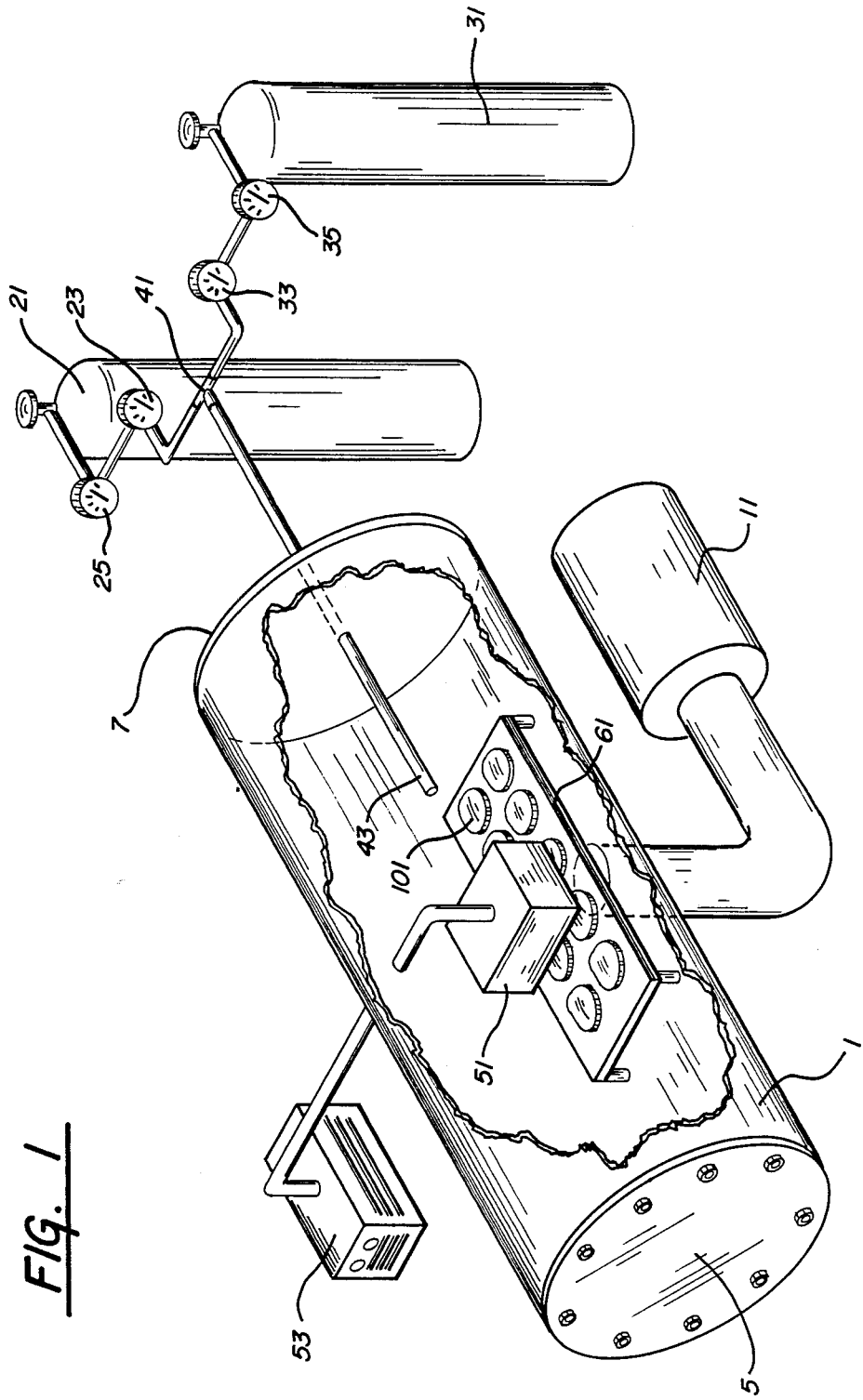
FIG. 1 is a partial phantom view of a vacuum deposition system for applying the coating to the substrate.

According to Applicants' invention there is provided a coated article having a substrate, e.g, a polymeric substrate or a semiconductor substrate, with an adherent, abrasion resistant, optically transmissive coating thereon. The hard coating is substantially colorless and transparent in the visible portion of the spectrum, and partially absorbing in the ultraviolet wave portion of the spectrum. The light transmission integrated over the visible spectrum is above about 87 percent when determined by the method of ASTM D-1003. The light transmission at 550 nanometers is above about 89 percent when determined using a spectrophotometer.

The microwave deposition of a carbon-diamond or carbon-silicon dioxide coating having graded order or composition allows a relatively thick but substantially colorless coating to be applied to a substrate that is mis-matched in a physical parameter, as modulus of elasticity, coefficient of thermal expansion, lattice parameter, size of microcrystalline inclusions, or volume fraction of microcrystalline material, to be deposited quickly and without deformation or degradation of the substrate or delamination of the coating. The coating is thick enough to be abrasion and impact resistant and to avoid or relieve stresses between the substrate and the mis-matched, outer portion of the coating, and thin enough to be light transmissive. The coating is on the order of about 1 to about 10 microns thick and preferably from about 2 to about 5 microns thick, with the compositionally and/or structurally graded portion of the coating being thick enough to modulate the mismatch of parameters and provide stress relief, e.g., from several atomic diameters to several microns, e.g., up to 10 microns. However, in an alternative exemplification the outer portion of the coating may have a thickness such as to provide, in combination with the index of refraction thereof and optionally of the underlying portion, anti-reflective and/or selectively reflective properties. Thus, the thickness of the outer portion may have a thickness of an odd quarter wave length to provide interference colors.

According to one exemplification the coating is formed of amorphous carbon at the substrate and either (1) ordered carbon or (2) silicon dioxide remote therefrom. At the coating-substrate interface, the coating is substantially amorphous, characterized by the substantial absence of long range order although it may include more ordered regions and even crystalline or polycrystalline regions therein. The coating is graded in composition and/or structure remote from the substrate. In the case of an amorphous carbon to diamond coating, it is ordered remote from the substrate, e.g., microcrystalline or polycrystalline remote from the substrate. The ordered portion of the coating structurally comprises carbon in tetrahedrally coordinated, diamond like or even diamond structure, characterized by a predominance of $sp^3$ bonding.

In the case of coating graded from amorphous carbon to diamond, the $sp^3$ bonding combined with the unique microwave method of application results in a particularly hard coating that is substantially colorless, and abrasion resistant, on a plastic substrate.

In an alternative exemplification the coating is carbon, matched in properties to an amorphous semiconductor substrate such as a photovoltaic device on electrophotographic drum, at the interface therewith, and graded to a diamond surface having a predominance of tetrahedral $Sp^3$ bonding remote from the semiconductor substrate.

In an alternative exemplification, the portion of the coating remote from substrate-amorphous carbon interface is silicon dioxide. By "silicon dioxide" is meant both stoichiometric $SiO_2$ and silicon suboxides.

The thickness of the gradation from amorphous at the substrate to crystalline carbon, e.g., diamond, or to silicon dioxide, remote from the substrate is a function of, inter alia, the degree of mis-match of the properties, i.e., lattice parameters, coefficients of elasticity, or thermal expansion coefficients, of the substrate and the hard coating, and may be from several atomic diameters to several microns.

The adherent, and preferably substantially light transmitting and ultraviolet absorbing coating is prepared by microwave deposition. A deposition coating system is shown in FIG. 1. The deposition coating system includes a vacuum chamber 1, having end plates 5 and 7 and a substrate carrier 61. The vacuum chamber 1 is evacuated by a vacuum pump 11. The vacuum chamber further includes means for feeding the reactive gas and inert gas, e.g. from tanks 21 and 31, through valves and regulators 23 and 25, and 33 and 35, to a fitting, for example "tee" fitting 41, and from the "tee" fitting 41 into the vacuum chamber through vacuum line 43. The deposition system further includes a microwave antenna or a microwave horn 51, and a microwave power supply 53. The microwave antenna 51 energizes the deposition gases, resulting in the formation of a plasma which then forms the coated articles 101.

The process is characterized by initially depositing the coating at a low microwave energy. This provides the disordered, e.g., amorphous, portion of the coating in contact with the substrate 121, or 221. Thereafter deposition is continued at a higher microwave energy to build up the coating.

Figure 5:
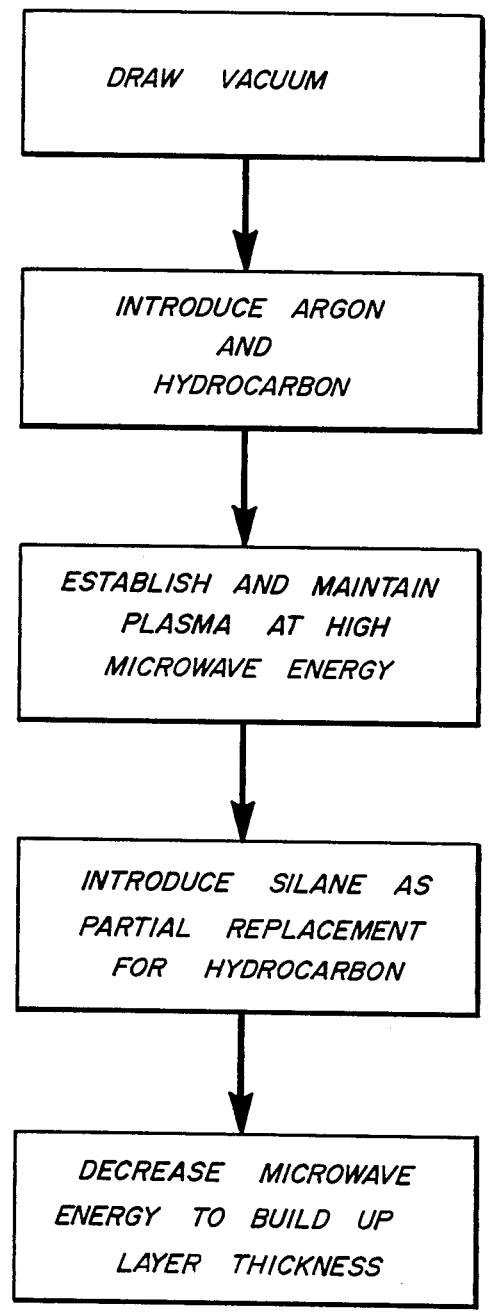
FIG. 5 is a flow chart of the method of forming the coated article of the invention.

This results in deposition of a rugged film of matched or modulated parameters, e.g., modulus of elasticity, coefficient of thermal expansion, lattice parameters, degree of crystallinity, or extent of crystallinity, inter alia with the substrate, 121, 221 without degradation or deformation of the substrate 121, 221. The flow chart for the process is shown in FIG. 5. The flow chart shows the specfic steps. First an initial vacuum of about $80 \times 10^{-9}$ atmosphere to about $100 \times 10^{-9}$ atmosphere is drawn.

At this low pressure, sputter etching is carried out to prepare the substrate. The sputter etching has been carried out with a 200 watt radio frequency signal, in argon at $10^{-4}$ to $10^{-6}$ atmospheres for 5 to 20 minutes.

Next, inert gas and hydrocarbon are introduced into the vacuum chamber 1. The ratio of inert gas to hydrocarbon varies from 7:1 to 1:7 and preferably about 1:1. For a three cubic foot vacuum chamber 1 a gas flow rate of about 40 standard cubic centimeters per minute provides efficient gas utilization. The residence of the gases is about 0.02 to about 0.10 seconds.

The hydrocarbon may be a saturated gaseous hydrocarbon, as methane, ethane, propane, or butane, or unsaturated, low molecular weight, hydrocarbon gas as ethylene, propylene, butene, or butadiene or even acetylene.

When the coating is compositionally graded, with $SiO_2$ remote from the interface, the silicon source is a silane. The silane is preferably a low molecular weight silane gas, for example monosilane, $SiH_4$, or disilane $Si_2H_6$ and the oxidant for $SiO_2$ formation may be $O_2$ or $N_2O$, with $N_2O$ preferred. The inert gas may be helium, neon, argon or krypton. Generally, for reasons of cost and energy transfer efficiency, the inert gas is argon.

A microwave plasma is established and maintained at a relatively low energy and high pressure to provide initial adhesion without deformation of the plastic substrate 121,221. This power is generally on the order of about 50 to 75 watts. The pressure is from 100 to 200 millitorrs. This low microwave energy and high pressure regime is maintained for about 15 to 30 minutes to establish a relatively thin, disordered, adherent coating.

The next step in the process is to increase the power and reduce the pressure while building up the thick coating without damaging, degrading, or deforming the substrate 121, 221. The power increase may be done as a single step, or as ramp. That is, the power increase may be instantaneous, or it may be carried out over a period of as long as 3 to 5 minutes. The thermal inertia, thermal capacitance, or time lag of the deposition process provides a continuous or semicontinuous change in the composition, structure, or parameters within the coating, i.e., grading. The power is increased to more than 75 watts e.g. to 100 watts or more for further build up of the coating. In the case of silicon dioxide th pressure is reduced to about 25 to 75 millitorrs. The high power, low pressure deposition is continued for a period of about 15 to 250 minutes whereby to get a thick coating having the desired properties. These may be the properties associated with ordered, crystalline, $sp^3$ localized order or the properties associated with disordered silicon dioxide. During this second stage of the deposition there may be partial replacement of the hydrocarbon with silane.

During the high energy phase of the deposition process, the deposition parameters are controlled so as to match the rates of ordered material growth and disordered material plasma etching. In this way disordered material is continuously removed while ordered material grows continuously.

In the case of deposition of diamond atop amorphous carbon, the pressure is increased during the high microwave energy phase.

Typical gaseous precursor mixtures which can be employed in the practice of the instant invention to deposit the diamond or diamond like outer portion of the graded coating comprise a gaseous precursor material such as methane diluted in a gaseous precursor diluent material such as hydrogen, helium, nitrogen, argon or mixtures thereof.

Throughout the process of depositing the herein contemplated graded coating on a thermally sensitive substrate, it is necessary to maintain the substrate below the temperature or time and temperature exposure where thermal degradtion of the substrate may occur. Thermal degrdation includes melting, softening, deformation, deleterious phase changes and transformations, decomposition, depolymerization, outgassing, and the like.

Figure 2:
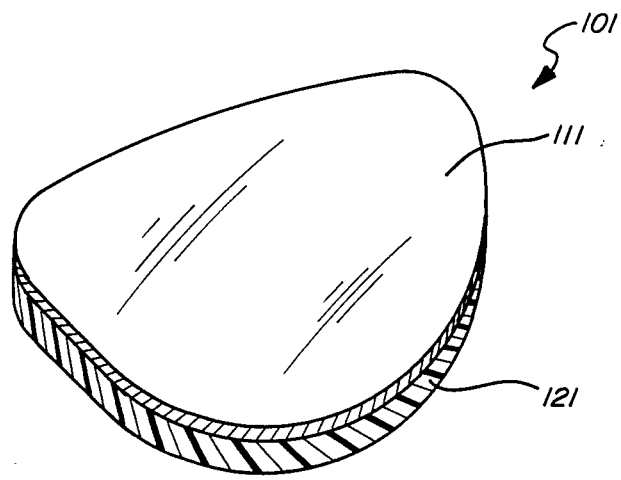
FIG. 2 is a partial isometric view, not to scale, of a coated plastic lens.

According to a particularly preferred exemplification of the invention a 3 inch×3 inch×⅛ inch polycarbonate coupon is placed in a three cubic foot volume vacuum chamber. The vacuum chamber is drawn down to a vacuum of about $80\times10^{-9}$ to about $100\times10^{-9}$ atmosphere. An argon-methane mixture is introduced into the 3 cubic foot vacuum chamber at a flow rate of about 20 standard cubic centimeters per minute for each gas, for a total gas flow rate of about 40 standard cubic centimeters per minute. The microwave horn is energized at an energy of about 65 to 100 watts to establish and maintain a plasma. Microwave power is maintained between 65 to 100 watts for about 15 to 30 minutes. Thereafter the power is increased to more than 65 to 100 watts, for example to a power of about 75 to 100 watts. The higher power is maintained for about 15 minutes to about 220 minutes to provide a total deposition time of up to about 250 minutes. This allows a build up of coating to a thickness of about 1 to about 10 microns and preferably about 2 to about 5 microns. During this relatively high power deposition stage of the process there may be partial replacement of the hydrocarbon, for example the methane, ethylene, or ethane, by a silane, for example monosilane, to provide a coating of silicon and carbon FIG. 2 shows an ophthalmic lens 101 having a plastic substrate 121. The plastic substrate may be a polycarbonate a polyacrylate, such as poly(methyl methacrylate) or a poly(allyl carbnate) such as PPG Industries "CR-39" (®) diethylene glycol bis (allyl carbonate), polymerized with a suitable peroxide initiator to form a hard, substantially light transmissive polymer.

The coating 111 is generally from about 1 to about 10 microns thick and particularly from about 2 to about 5 microns thick. It comprises carbon or carbon-silicon dioxide where the silicon dioxide, when present, is graded from substantially no silicon dioxide in the first micron to an increasing amount measured outward from the substrate 121.

The plastic substrate could also be a plastic optical fiber, or laser mirror, or a plastic sheet, as a door, window, sun roof insert, or the like.

Figure 3:
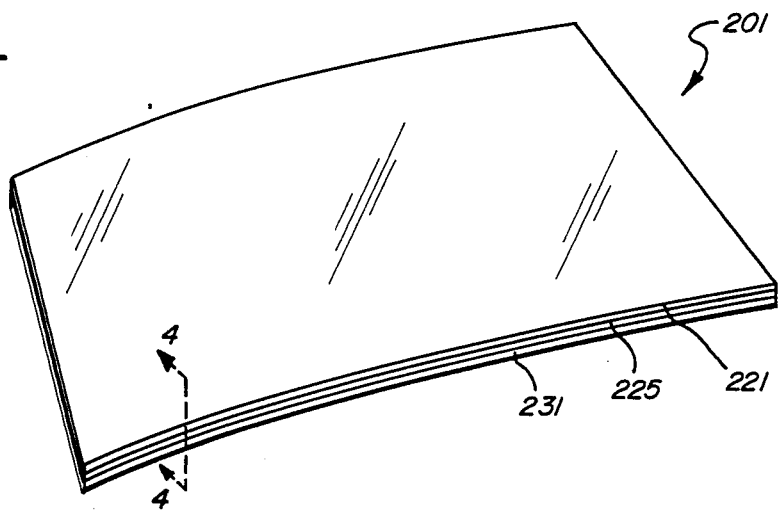
FIG. 3 is a partial isometric view of a bi-layer windshield having the hard coating on the exposed surface of the plastic.
Figure 4:
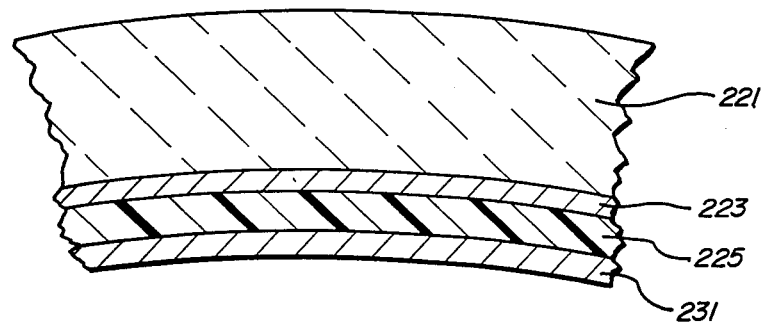
FIG. 4 is a partial cutaway view through o cutting plane 4—4' of the windshield of FIG. 3 showing the glass substrate, the polyvinyl alcohol adhesive, the polyurethane bi-layer, and the hard coating.

According to a further exemplification of the invention the coated article may be a glass-plastic laminate having the contemplated hard coating on the surface of the plastic unprotected from the glass. Exemplary is a windshield 201 as shown in FIG. 3 and 4. However the article could be a window, a storm door glazing unit, or a sliding door glazing unit.

The windshield 201 includes a glass substrate 221 with a thin adhesive layer 223 of, for example, polyvinyl alcohol, and a plastic film 225, for example a substantially water white polyurethane. The hard coating for example the carbon or carbon silicon coating 231 is on the unprotected surface of the plastic layer 225. This results in a significant reduction in abrasion and scratching of the plastic 225.

Figure 6:
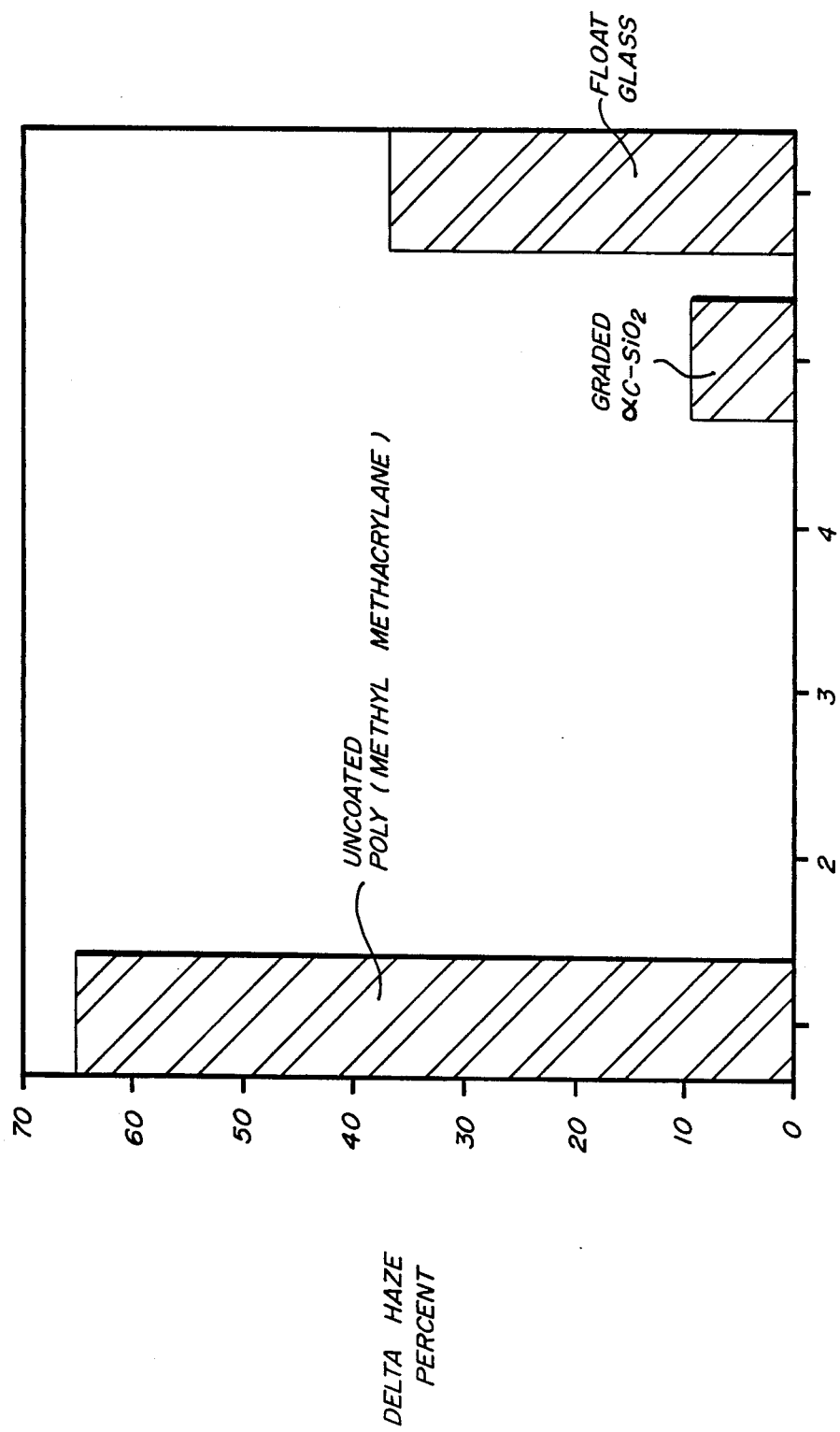
FIG. 6 is a bar graph of the comparison of the increase in haze by the Falling Sand Test with SiC #80 by ASTM Standard 968 for uncoated poly(methyl methacrylate), the amorphous carbon - $SiO_2$ compositional graded coating of the invention, and float glass.

A series of tests were conducted where a poly(methyl methacrylate) coupon, a float glass coupon, and a poly(-carbonate) coupon with a compositionally graded amorphous carbon-silicon dioxide coating were tested using number 80 silicon carbide under ASTM Standard 968. The silicon carbide granules fell from a height of 1 meter at a rate of 320±10 grams per minute. The haze of the uncoated poly(methyl methacrylate) increased by 65 percentage points, the haze of the uncoated float glass increased by about 35 percentage points, and the haze of the amorphous carbon-silicon dioxide coated polyacrylic increased by less than 10 percentage points. This data is shown in the bar graph of FIG. 6.

Figure 7:
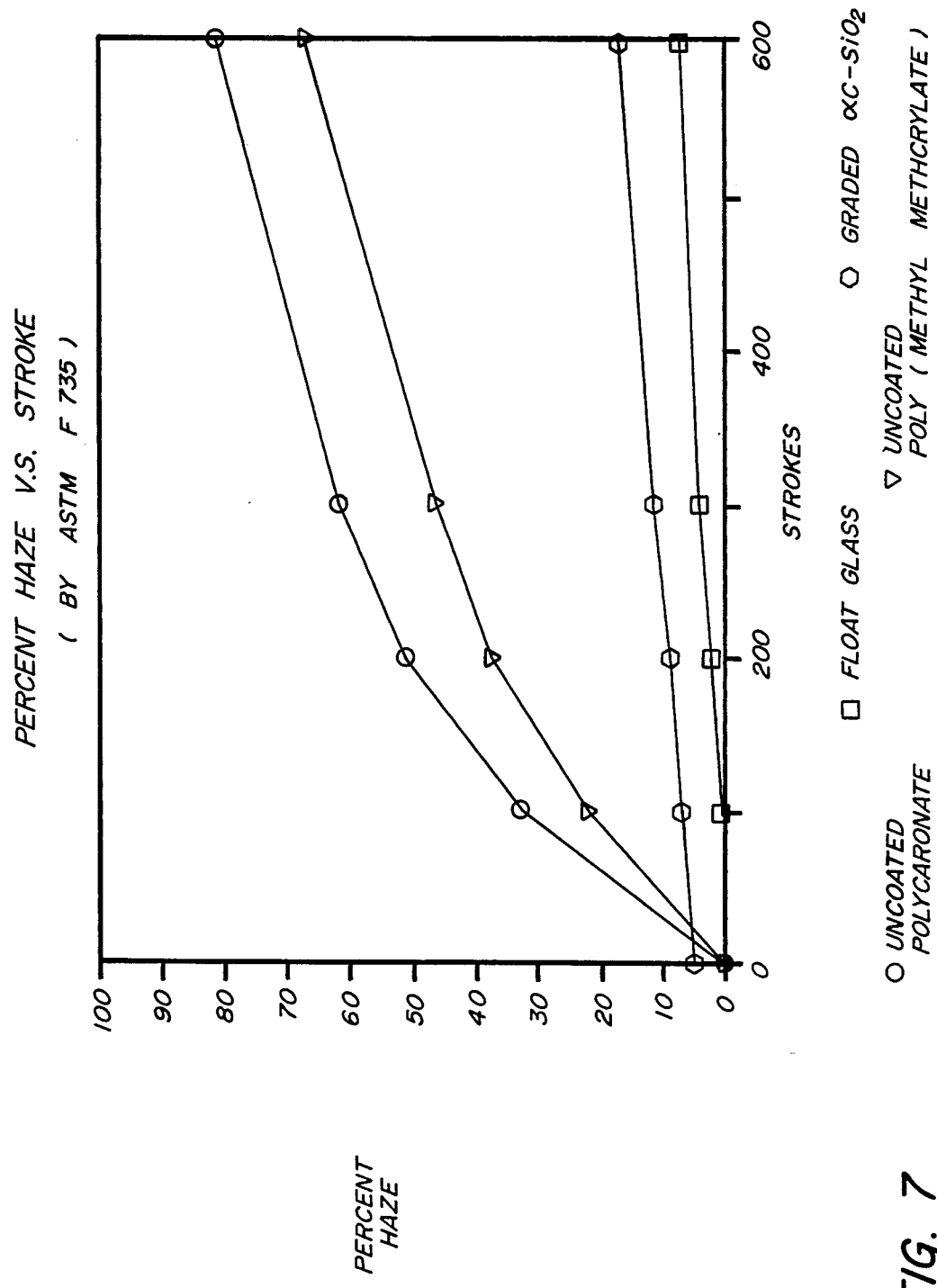
FIG. 7 is a graph of haze versus strokes by ASTM Standard F-735 for polycarbonate, poly(methyl methacrylate), float glass, and the amorphous carbon-$SiO_2$ compositionally graded coating of the invention.

Coupons of uncoated polycarbonate, and uncoated poly(methyl methacrylate), having the compositionally graded amorphous carbon - silicon dioxide coating were tested for percent haze by the method of ASTM Standard F-735. The results are Plotted in FIG. 7.

According to a still further exemplification the substrate may be a metal substrate or a semiconductor substrate, e.g., a soft metal substrate, as an aluminum or copper substrate, or an amorphous alloy of silicon, where the coating is an amorphous material in contact with the substrate and an ordered material therefrom. Thus, an amorphous silicon body may carry a carbon coating that is substantially amorphous at the silicon - carbon interface, and substantially tetrahedrally coordinated, diamond-like or diamond carbon remote therefrom.

Figure 8:
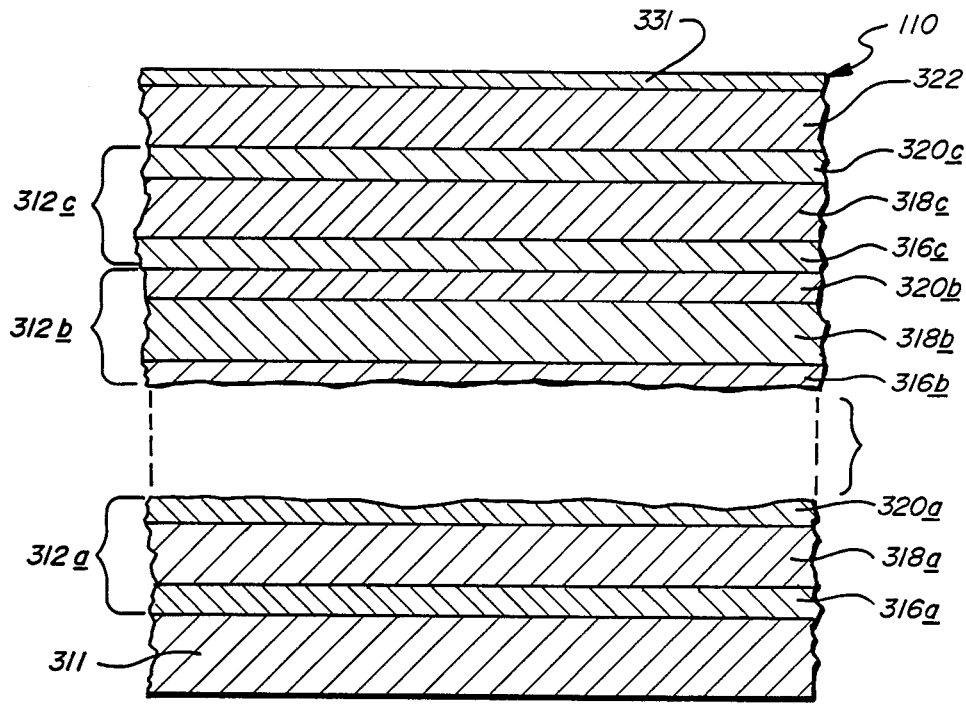
FIG. 8 is a greatly enlarged, fragmentary, cross sectional view of a continuous length of large area semiconductor material comprising a plurality of stacked n-i-p photovoltaic cells.

FIG. 8 illustrates a large-area-body of semiconductor material configured as a photovoltaic cell formed of a plurality of successive n-i-p type layers each of which includes preferably an amorphous thin film semiconductor alloy material and the compositionally or structurally graded external coating of this invention.

More particularly, FIG. 8 shows an n-i-p type photovoltaic device, such as a solar cell or imager, made up of a plurality of stacked individual n-i-p type cells 312a, 312b and 312c. Below the lowermost cell 312a is a substrate 311 which may be transparent or formed from a metallic material such as stainless steel, aluminum, tantalum, molybdenum, chrome or metallic particles embedded within an insulator. Although certain applications may require a thin oxide layer and/or a series of base contacts prior to the application of the amorphous material, for purposes of this application, the term "substrate" shall include not only a flexible film, but also any element added thereto by preliminary processing. Also included within the scope of the present invention are substrates formed of glass, a glass-like material, or a synthetic polymeric material on which an electrically conductive electrode is applied.

Each of the cells 312a, 312b and 312c are preferably fabricated with a thin film semiconductor body containing at least a silicon alloy. Each of the semiconductor bodies includes a p-type conductivity semiconductor layer 320a, 320b and 320c; a substantially intrinsic semiconductor layer 318a, 318b and 318c and an n-type conductivity semiconductor layer 316a, 316b, and 316c. Note that the intrinsic layer may include traces of n-type or p-type dopant material without forfeiting its characteristic neutrality. Hence, it may be referred to herein as a "substantially intrinsic layer". As illustrated, cell 312b is an intermediate cell and as indicated in FIG. B, additional intermediate cells may be stacked atop the illustrated cells without departing from the spirit or scope of the present invention.

Following the deposition of the semiconductor alloy layers, a further deposition process may be either performed in a separate environment or part of a continuous process. In this step a TCO (transparent conductive oxide) layer 322 is added. This layer 322 forms the upper electrode of the photovoltaic device. As illustrated, the large-area device 110 functions as a photovoltaic cell; however, it is frequently desirable to configure the large area device 310 into a plurality of smaller area cells.

The photovoltaic cell illustrated in FIG. 8 is preferably modularized for delivery to the ultimate consumer. Heretofore, plastic laminates such as TEDLAR (registered trademark of Dupont Corp.) were used to encapsulate the upper surface of said cell. However, such plastic encapsulants tended to deteriorate with age, required complicated processing techniques and added unnecessary weight to the lightweight cells described hereinabove. Through the principles disclosed herein, it is now possible to deposit coatings which are hard, wear-resistant, impervious to atmospheric contaminants, and ameanable coating by continuous vapor deposition processes. By the instant invention, such lightweight, ultra-wear resistant coatings 331 may be vapor deposited upon the cell. For example, and in accord with the principles of the instant invention, a layer of graded composition and/or structure can be deposited by a roll-to-roll process so as to be integrally affixed to the top surface of the TCO layer of the photovoltaic cell.

Figure 9:
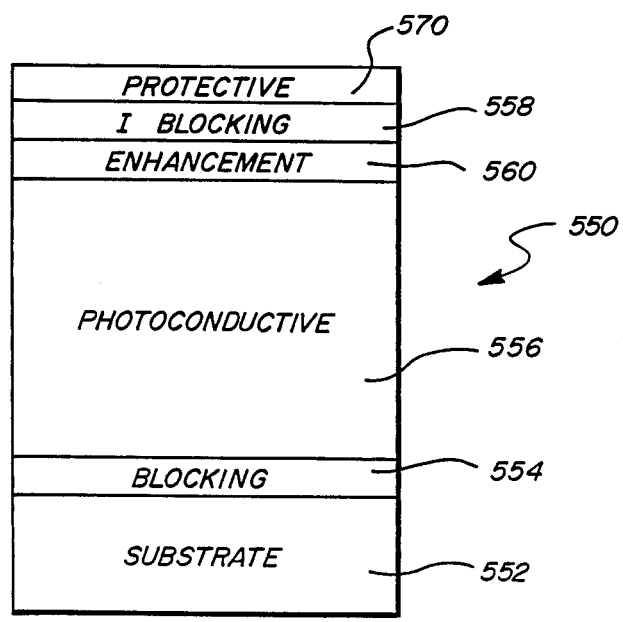
FIG. 9 is a greatly enlarged, fragmentary, cross sectional view of a portion of an electro photographic drum.

FIG. 9 illustrates a section 550 of the surface of an electrophotographic drum. The drum has a photoconductive portion formed of the drum substrate 552, a bottom blocking layer 554, a photoconductive layer 556, an optional enhancement layer 560, a top blocking layer 558, and a transparent, hard layer 570 graded in composition and/or structure.

The substrate 552 can be formed of any convenient material which is either conductive, such as a metal, or has a conductive coating formed thereon, such as glass or a polymer. The first or bottom blocking layer 554 is formed of either an n-type or a p-type microcrystalline or amorphous silicon, hydrogen and/or fluorine alloy. When the device 550 is a positively charged device the bottom blocking layer 554 prevents electron injection from the substrate 552 into the photoconductive layer 556. When the device 550 is a negatively charged device, the bottom blocking layer 554 prevents hole injection from the substrate 552 into the photoconductive layer 556. This layer is from 50 Angstroms to 1 micron thick.

The photoconductive layer 556 is 10 to 25 microns thick. The 10 micron thickness is to ensure a saturation voltage of about 350 volts. The photoconductive alloy can sustain an electric field of up to about 35 to 70 volts per micron of thickness. The layer 556 preferably is formed by microwave deposition from a reaction gas mixture of $SiH_4$ or $SiH_4$ and/or $SiF_4$ with a small amount of p-type dopant to form a substantially intrinsic or slightly pi-type alloy. The alloy with no dopant is slightly n-type exhibiting a Delta(E) of 0.7 eV. The addition of the small amount of p-type dopant changes Delta(E) to about 1.0 eV.

An enhanced top blocking layer 560 is deposited before the layer 558. Although the microwave deposition provides a high quality alloy layer 556, the alloy layer 556 can contain more defects than a properly deposited RF layer. The layer 560 is then deposited by a conventional RF plasma to provide a high quality layer with a density of states which is lower than the microwave deposited photoconductive layer 556. The RF layer 560 enhances the layer 558, because the lower density of states provides greater band bending and thus better charge retention, dark decay characteristics and freedom from fatiguing effects due to repeated light exposure and exposure due to certain atmospheric species which have been reported to reduce device performance. The effective overall deposition rate and reaction gas utilization is not lowered too significantly, since the layer 560 preferably is on the order of a depletion width thick, generally 1000 to 4000 Angstroms. The layer 560 can be deposited from the same reaction gas mixture as the photoconductive layer 556.

The top blocking layer 558 is formed to provide a very hard surface as compared to any photoconductive material as for example silicon, or chalcogenides, such as Se or $Se_{92}Ti_8$. The layer 558 is chemically resistant to moisture and temperature effects to provide the member with improved stability. The layer has a band gap of greater than 2.0 eV.

The herein contemplated, transparent protective layer 570 provides an added measure of durability and toughness. It is graded in composition and/or structure, i.e., from amorphous carbon at its interface with the top blocking layer 558 to either amorphous $SiO_2$ or diamond remote therefrom.

While the invention has been described with respect to certain claims and certain exemplifications thereof it is not intended to limit the scope of the invention thereby but solely by reference to the claims appended hereto.

We claim:

1. A coated article comprising:
   (a) a substrate chosen from the group consisting of soft metals, semiconductors and organic polymers; and
   (b) an adherent, abrasion resistant coating thereon substantially amorphous and consisting essentially of carbon at the substrate-coating interface, graded in composition remote from the substrate-coating interface, and consisting essentially of one or more of C, or silicon dioxide, and mixtures thereof, where the compositionally graded material remote from the substrate-coating interface comprises SiOx where x is from 1.60 to 2.00.

2. The coated article of claim 1 wherein the coating has a a thickness of 2 to 5 microns and a transmissivity of 89 percent at wavelengths in the visible spectrum.

3. The coated article of claim 1 wherein the coated article has a polymeric substrate.

4. The coated article of claim 7 wherein the substrate is a polymer chosen from the group consisting of polyacrylates, polycarbonates, poly(allyl carbonates), and polyurethanes.

5. The coated article of claim 1 wherein the coated article has a metallic substrate or semiconductor substrate.

6. The coated article of claim 5 wherein the metallic substrate is a soft metallic substrate.

7. The coated article of claim 5 wherein the semiconductor substrate comprising amorphous silicon.

8. The coated article of claim 1 wherein the coating is prepared by the method comprising:
   (a) providing a substrate to be coated in a vacuum chamber;
   (b) providing a deposition gas comprising an inert gas and an active gas chosen from the group consisting of hydrocarbons and silanes;
   (c) maintaining the deposition gas at a pressure of less than $10^{-6}$ atmospheres;
   (d) forming and maintaining a microwave plasma in contact with the substrate at an initial relatively high microwave power to decompose the gas and deposit a disordered coating a the substrate; and (e) thereafter maintaining the microwave plasma in contact with the substrate at a relatively higher power and a graded gas pressure and increasing the silane content of the gas to build up the graded portion of the coating.

9. The coated article of claim 1 wherein
the coating thereon is matched in stress influencing parameters at an interface with the substrate, mismatched in stress influencing parameters remote from the substrate, and graded in stress influencing parameters therebetween.

10. The coated article of claim 9 wherein the coating is matched to the substrate of the interface therewith in one or more stress influencing parameters chosen from the group consisting of modulus of elasticity, coefficient of thermal expansion, lattice parameters, extent of crystallinity, or degree of crystallinity.

11. The coated article of claim 9 wherein the coating is graded with respect to one or more stress influencing parameters chosen from the group consisting of composition, modulus of elasticity, coefficient of thermal expansion, lattice parameters, extent of crystallization, or degree of composition over a depth of several atomic diameters to 10 microns.

12. The coated article of claim 9 wherein the substrate is an amorphous silicon alloy semiconductor.

13. The coated article of claim 9 wherein the substrate is a transparent conductive oxide.

* * * * *